United States Patent
Hempenius et al.

(10) Patent No.: US 8,310,651 B2
(45) Date of Patent: Nov. 13, 2012

(54) LITHOGRAPHIC APPARATUS, METHOD AND DEVICE MANUFACTURING METHOD

(75) Inventors: Peter Paul Hempenius, Nuenen (NL); Johan Hendrik Geerke, Eindhoven (NL); Youssef Karel Maria De Vos, Lille (BE); Nicolaas Bernardus Roozen, Heeze (NL); Erwin Antonius Henricus Fransiscus Van Den Boogaert, Someren-Eind (NL); Alexander Cornelis Geerlings, Boxmeer (NL)

(73) Assignee: ASML Netherlands B.V., Veldhoven (NL)

( * ) Notice: Subject to any disclaimer, the term of this patent is extended or adjusted under 35 U.S.C. 154(b) by 919 days.

(21) Appl. No.: 12/363,144

(22) Filed: Jan. 30, 2009

(65) Prior Publication Data

US 2009/0195760 A1 Aug. 6, 2009

Related U.S. Application Data

(60) Provisional application No. 61/006,781, filed on Jan. 31, 2008.

(51) Int. Cl.
*G03B 27/42* (2006.01)
(52) U.S. Cl. .......................................... 355/53
(58) Field of Classification Search ...................... 355/53
See application file for complete search history.

(56) References Cited

U.S. PATENT DOCUMENTS

| | | | |
|---|---|---|---|
| 6,450,288 B1 | 9/2002 | Akiyama et al. | |
| 6,478,110 B1 * | 11/2002 | Eatwell et al. | 181/207 |
| 6,714,278 B2 * | 3/2004 | Kamiya | 355/30 |
| 7,193,722 B2 | 3/2007 | Boogaarts et al. | |
| 7,969,550 B2 | 6/2011 | Geerke et al. | |
| 2008/0259299 A1 | 10/2008 | Geerke et al. | |

FOREIGN PATENT DOCUMENTS

| | | |
|---|---|---|
| JP | 10-209040 A | 8/1998 |
| JP | 2005-197698 A | 7/2005 |
| JP | 2005-274762 A | 10/2005 |
| JP | 2008-270801 A | 11/2008 |
| WO | WO 99/39333 A1 | 8/1999 |
| WO | WO 00/16371 A1 | 3/2000 |

OTHER PUBLICATIONS

English-Language Abstract of Japanese Patent Publication No. 10-209040 A, published Aug. 7, 1998; 1 page.
English-Language Abstract of International Patent Publication No. 99/039333 A1, published Aug. 5, 1999; 1 page.

(Continued)

*Primary Examiner* — Peter B Kim
*Assistant Examiner* — Mesfin T Asfaw
(74) *Attorney, Agent, or Firm* — Sterne, Kessler, Goldstein & Fox P.L.L.C.

(57) ABSTRACT

In an embodiment, a lithographic apparatus includes an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a passive noise damper configured to dampen gas borne noise caused by movement of a movable part of the lithographic apparatus.

6 Claims, 3 Drawing Sheets

OTHER PUBLICATIONS

English-Language Abstract of International Patent Publication No. 00/016371 A1, published Mar. 23, 2000; 1 page.
English-Language Abstract of Japanese Patent Publication No. 2005-197698 A, published Jul. 21, 2005; 1 page.
English-Language Abstract of Japanese Patent Publication No. 2005-274762 A, published Oct. 6, 2005; 1 page.
English-Language Abstract of Japanese Patent Publication No. 2008-270801 A, published Nov. 6, 2008; 1 page.
English-Language Translation of Notice of Reasons for Rejection directed to related Japanese Patent Application No. 2009-012431, mailed Jun. 28, 2011, Japanese Patent Office; 3 pages.

* cited by examiner

LITHOGRAPHIC APPARATUS, METHOD AND DEVICE MANUFACTURING METHOD

CROSS-REFERENCE TO RELATED APPLICATIONS

The present application claims the benefit of U.S. Provisional Patent Appl. No. 61/006,781, filed Jan. 31, 2008, which is incorporated by reference herein in its entirety.

BACKGROUND

1. Field

Embodiments of the present invention relate to a lithographic apparatus, a method for reducing gas borne noise in a lithographic apparatus, and a method for manufacturing a device.

2. Background

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic process of a lithographic apparatus it is desirable that at least the patterning device, the projection system and the substrate stage be properly aligned with respect to each other, so that the pattern which is provided by the patterning device in the radiation beam is properly projected on a target portion of the substrate without, for example, overlay errors, imaging errors or focus errors. In particular, in scanners in which the patterning device support (reticle stage) and the substrate table (substrate stage) are movable to position a particular part of the pattern with respect to a particular part of the substrate, high accuracy positioning is desired. For these movements, positioning systems are provided which control the position of the patterning device support and substrate table with high accuracy.

With continuously increasing demands on the accuracy of imaging, for instance overlay and focus on the one hand and throughput on the other, proper alignment of patterning device support, projection system and substrate table is desirable. For increasing the throughput of the lithographic apparatus, it is desirable to increase the speed and acceleration with which the patterning device support and substrate table are moved and aligned with respect to each other and the projection system.

However, moving the patterning device support or the substrate table may result in gas flows and pressure waves which may propagate through the space in which these stages but also the projection system are present. Also, the actuation forces of the patterning device support and substrate table may cause vibrations of parts of the stage resulting in gas flows and/or pressure waves, such as acoustic signals or gas flows through the working space. These gas flows and/or pressure waves may excite the projection system, or at least parts of the projection system such as the lenses, or the frame on which the projection system is mounted. The gas flows and/or pressure waves may also excite other parts of the lithographic apparatus relevant for the alignment of the patterning device support, projection system and substrate table such as a sensor or sensor target object of a stage position measurement system. The excitation of the projection system, or the other parts, may cause imaging errors such as errors in overlay, fading and/or focus.

Generally, it has been found that there are three sources for excitation of the projection system by movements of the patterning device support. One source type is gas borne noise, i.e. noise borne by the gas present between the patterning device support and the projection system, for instance air. This gas borne noise is typically the result of the acceleration of the patterning device support, whereby the gas column before the patterning device support in the direction of movement is pressed away by the moving patterning device support, while gas is sucked into the space created by the moving patterning device support. This gas borne noise may typically be low frequency noise, for instance lower than 150 Hz, and may result in overlay errors.

Another source type is structure borne noise. The movement of the patterning device support and the forces desired for that movement may result in excitation of a number of parts of the patterning device support or the support structure of the patterning device support. This excitation may be transferred to the projection system via the structural transmission path or via the acoustics transmission path of the lithographic apparatus, for instance a frame or combination of frames which supports both the patterning device support and the projection system. This structure borne noise may typically be of a higher frequency range, for instance above 150 Hz and may have a negative effect on overlay and/or fading.

Furthermore, the excitation of the parts of the patterning device support or the support structure of the patterning device support may also result in vibrations of these parts. These vibrating parts may also cause pressure waves that excite the projection system or other elements. This results in relative high frequency vibrations of the projection system or other elements, causing a negative effect on overlay and/or fading.

A third source type is vortex shedding or turbulences, caused by sharp edges of the moveable object. This may generate noise typically of a higher frequency range, for instance above 500 Hz.

SUMMARY

A lithographic apparatus is provided in which the excitation of an element sensitive for disturbances due to gas borne noise as a result of movements of a movable object is substantially reduced. For example, a lithographic apparatus is provided in which the excitation of the projection system due to gas borne noise as a result of movements of the patterning device support is substantially reduced.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam;

a substrate table constructed to hold a substrate; a projection system configured to project the patterned radiation beam onto a target portion of the substrate, and a passive noise dampener configured to dampen or prevent gas borne noise caused by movement of a movable part of the lithographic apparatus.

According to an embodiment of the invention, there is provided a method for reducing gas borne noise in a lithographic apparatus, by providing a passive noise dampener configured to dampen or prevent gas borne noise caused by movement of a movable part of the lithographic apparatus.

According to an embodiment of the invention, there is provided a device manufacturing method including coating a substrate with a radiation-sensitive material, projecting a patterned beam of radiation onto the substrate using a lithographic apparatus including an illumination system configured to condition a radiation beam, a support constructed to support a patterning device, the patterning device being capable of imparting the radiation beam with a pattern in its cross-section to form a patterned radiation beam, a substrate table constructed to hold a substrate, a projection system configured to project the patterned radiation beam onto a target portion of the substrate, and a passive noise dampener configured to dampen gas borne noise caused by movement of a movable part of the lithographic apparatus, developing the substrate, and baking the substrate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
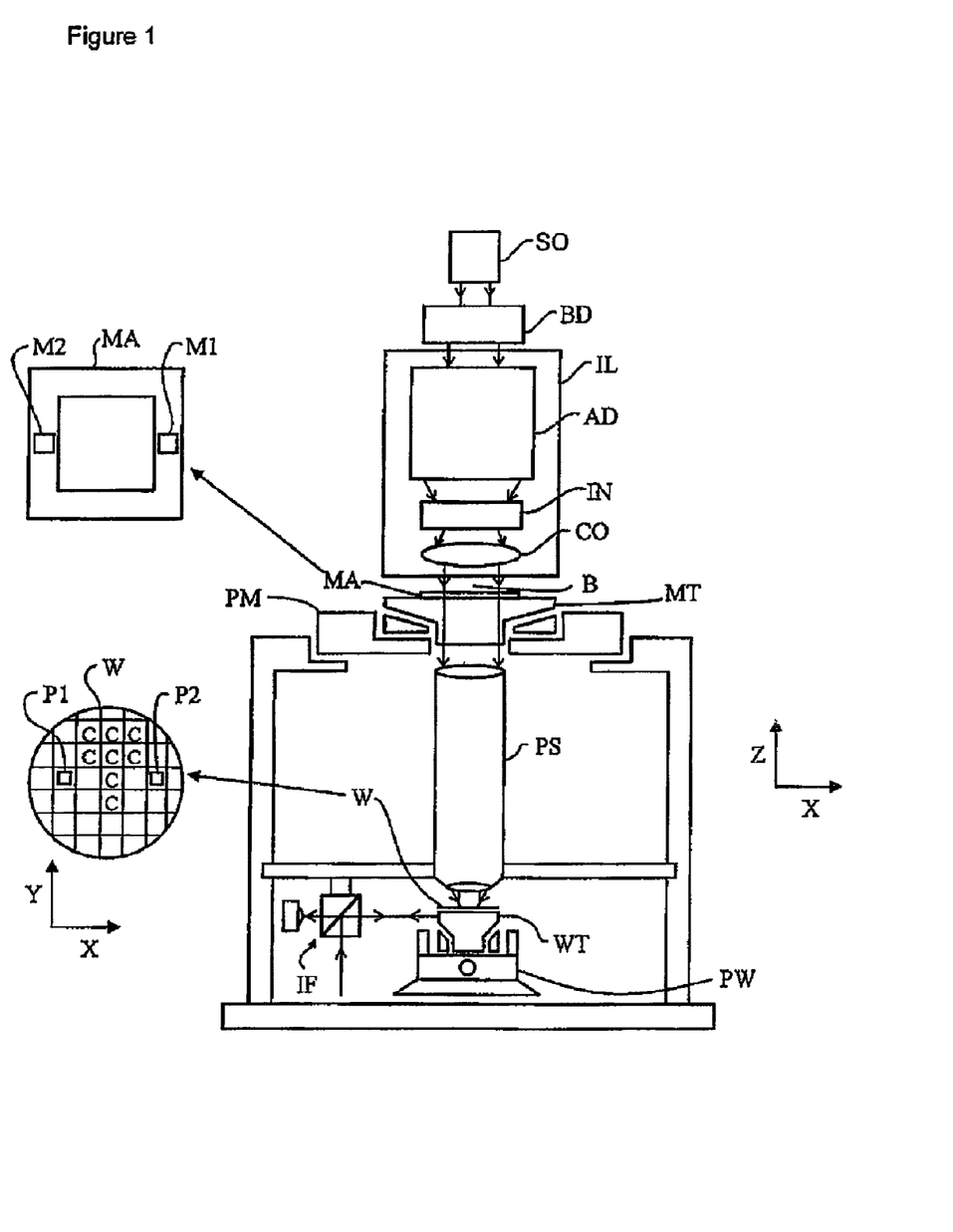
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. ultraviolet (UV) radiation or any other suitable radiation), a patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to radiation beam B by patterning device MA onto a target portion C (e.g. including one or more dies) of substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on the patterning device (e.g., mask) MA, which is held on the patterning device support (e.g., mask table MT), and is patterned by the patterning device. Having traversed patterning device (e.g. mask) MA, radiation beam B passes through projection system PS, which focuses the beam onto a target portion C of substrate W. With the aid of second positioning device PW and position sensor IF (e.g. an interferometric device, linear encoder or capacitive sensor), substrate table WT can be moved accurately, e.g. so as to position different target portions C in the path of radiation beam B. Similarly, first positioning device PM and another position sensor (which is not explicitly depicted in FIG. 1) can be used to accurately position patterning device (e.g. mask) MA with respect to the path of radiation beam B, e.g. after mechanical retrieval from a mask library, or during a scan. In general, movement of patterning device support (e.g. mask table) MT may be realized with the aid of a long-stroke module (coarse positioning) and a short-stroke module (fine positioning), which form part of first positioning device PM. Similarly, movement of substrate table WT or "substrate support" may be realized using a long-stroke module and a short-stroke module, which form part of second positioner PW. In the case of a stepper (as opposed to a scanner) patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on patterning device (e.g. mask) MA, the mask alignment marks may be located between the dies.

The depicted apparatus could be used in at least one of the following modes:

1. In step mode, patterning device support (e.g. mask table) MT or "mask support" and substrate table WT or "substrate support" are kept essentially stationary, while an entire pattern imparted to the radiation beam is projected onto a target portion C at one time (i.e. a single static exposure). Substrate table WT or "substrate support" is then shifted in the X and/or Y direction so that a different target portion C can be exposed. In step mode, the maximum size of the exposure field limits the size of the target portion C imaged in a single static exposure.

2. In scan mode, patterning device support (e.g. mask table) MT or "mask support" and substrate table WT or "substrate support" are scanned synchronously while a pattern imparted to the radiation beam is projected onto a target portion C (i.e. a single dynamic exposure). The velocity and direction of substrate table WT or "substrate support" relative to patterning device support (e.g. mask table) MT or "mask support" may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, patterning device support (e.g. mask table) MT or "mask support" is kept essentially stationary holding a programmable patterning device, and substrate table WT or "substrate support" is moved or scanned while a pattern imparted to the radiation beam is projected onto a target portion C. In this mode, generally a pulsed radiation source is employed and the programmable patterning device is updated as desired after each movement of substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
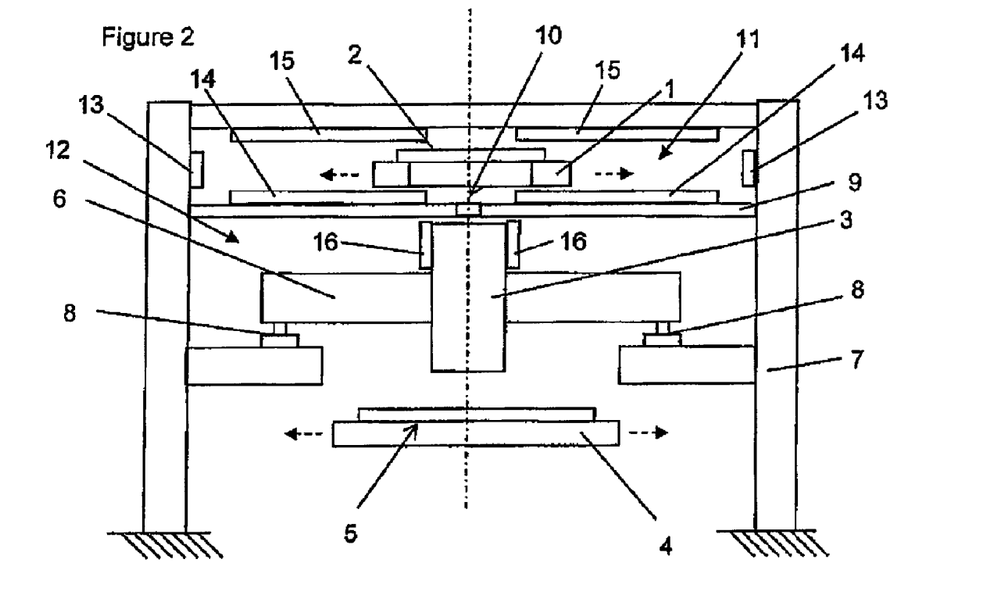
FIG. 2 depicts a part of the lithographic apparatus of FIG. 1 in accordance with an embodiment of the invention.

FIG. 2 depicts a part of the lithographic apparatus of FIG. 1. Patterning device stage 1 supports a patterning device. Patterning device stage 1 is located above a projection system 3. Under the projection system 3, a substrate stage 4 carrying a substrate 5 is positioned. Patterning device stage 1 and substrate stage 4 are movable with high accuracy so that during projection patterning device stage 1 and substrate stage 4 can be moved with a scanning movement with respect to projection system 3 to project a projection beam having a pattern imparted by reticle 2 on a target portion of substrate 5 supported by substrate stage 4.

Projection system 3 is supported by a metrology frame or metro-frame 6 which is a substantially stationary frame. Metro-frame 6 is mounted on a base frame 7 by a number of air mounts 8. These air mounts 8 may include active or passive damping devices so that any vibrations in base frame 7 are not passed on to metro-frame 6. In this way, projection system 3 is substantially isolated from vibrations in base frame 7 in order to decrease imaging errors such as overlay or focus errors in the projection of the patterned beam on substrate 5 due to vibration/movement of projection system 3.

However, the movement of patterning device stage 1 may cause gas flows and pressure waves, e.g., gas borne noise, around patterning device stage 1 and as a result in the process area, i.e. the area in which patterning device stage 1, projection system 3 and substrate stage 4 are arranged. The movements may also cause vibrations of the patterning device support of the patterning device stage. This structure borne noise may also cause disturbances of elements sensitive therefore, for instance projection system 3.

The structure borne noise may cause vibrations of these elements, which again may result in a gas borne noise, e.g., gas flows or pressure waves. This indirect gas borne noise is thus indirectly caused by the movements of the patterning device stage.

Some of the gas flows and/or pressure waves resulting from the movement of patterning device stage 1 may propagate in the direction of projection system 3 or metro-frame 6 supporting projection system 3.

In a conventional lithographic apparatus, projection system 3 or metro-frame 6 may be excited by these gas flows and/or pressure waves which may result in movements of the projection system, in particular the lenses and/or other optical elements in projection system 3. These movements may influence the radiation beam passing through projection system 3, resulting in overlay and/or focus errors and/or fading. This is undesirable.

In an embodiment of the present application such parts, e.g. the projection system and the metro-frame, are regarded to be sensitive for gas flows and/or pressure waves. In this embodiment, in particular, parts of the lithographic apparatus which when exposed to gas flows and/or pressure waves are influenced such that the accuracy of projection, e.g. overlay, fading and/or focus, of the lithographic apparatus is decreased, are regarded to be sensitive to gas flows and/or pressure waves. Such parts may for instance include sensors or sensor target objects, such as interferometers or an encoder grating or grid of a stage position measurement system.

In the lithographic apparatus of FIG. 2, a shield device is provided in the form of a shield plate 9, which is arranged between reticle stage 1 on the one hand and projection system 3 and metro-frame 6 on the other hand. In an embodiment, shield plate 9 is a relatively compliant and heavy plate configured to substantially absorb or reflect the gas flows and/or pressure waves, and may be mounted on base frame 7 so that resulting reaction forces are led to other parts of the lithographic apparatus. When desired, shield plate 9 may be flexibly supported in order to isolate shield plate 9 structurally from the base frame 7 to avoid generation of gas flows and/or pressure waves by shield plate 9 itself. By the provision of shield plate 9, all gas flows and/or pressure waves running in the direction of projection system 3 or metro-frame 6 will at least for a large extent be absorbed or reflected by shield plate 9 and thus not reach projection system 3 or metro-frame 6. As a result, projection system 3 and/or metro-frame 6 may not or may be substantially less excited by the gas flows and/or pressure waves and the accuracy of projection may not be negatively influenced by the presence of the gas flows and/or pressure waves caused by the gas borne and structure borne noise of patterning device stage 1.

In an embodiment, shield plate 9 extends between the whole area in which patterning device stage 1 can be moved, at least during the exposure phase, and the location of projection system 3 and, in an embodiment, also metro-frame 6 in the case the metro-frame is sensitive to the gas flows and/or pressure waves. At the location where the patterned beam of radiation crosses shield plate 9, an opening 10 is provided in shield plate 9 in order for the patterned beam of radiation to pass through shield plate 9.

The shield plate and alternative embodiments thereof are described in more detail in the commonly assigned U.S. patent application Ser. No. 11/785,751, filed on Apr. 19, 2007, which is herein incorporated in its entirety by reference.

Due to the presence of opening 10 in the shield plate, or any other opening between compartment 11 in which patterning device stage 1 is mounted and compartment 12 in which projection system 3 is arranged, it is still possible that the gas flows and/or pressure waves may reach projection system compartment 12. This is also a result of the reverberation of gas flows and/or pressure waves in stage compartment 11. As a result, the gas flows and/or pressure waves may still enter the projection system compartment through opening 10 causing excitation of projection system 3.

According to an embodiment of the present invention, it is proposed to arrange a number of panel absorbers 13, 14, 15, and 16 in the lithographic apparatus. These panel absorbers act as passive noise dampeners.

Figure 3:
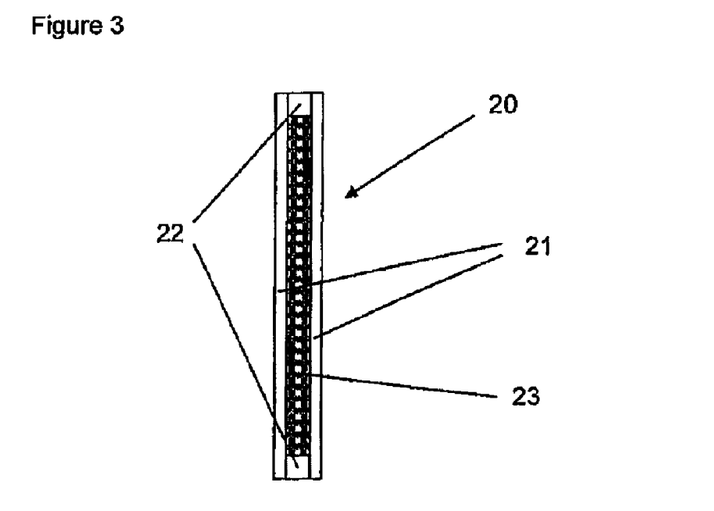
FIG. 3 depicts a cross section of an example of a (resonant) panel absorber in accordance with an embodiment of the invention.

In FIG. 3, an example of a panel absorber 20 according to an embodiment of the invention is shown in more detail. A panel absorber 20 is a resonant system including two plate shaped objects 21 spaced from each other, for instance by spacers 22. Between the two plate-shaped objects a sound absorbing material 23, such as glass fiber or foam material, may be placed. In an alternative embodiment, the space between the plate-shaped objects may be filled with gas, for instance air. In an embodiment, plate shaped objects 21 may be perforated to obtain a different behavior of the panel absorber.

A benefit of a panel absorber over a body of noise absorbing material, such a foam material, is that a panel absorber may have a relatively broadband effective frequency range that may be tuned to the desired frequency range. The effective frequency range is typically much lower than the effective frequency range of a separate body of foam material. This has the result that for the application of an embodiment of the present invention in which the relevant frequency range is typically a few hundred Hz, the thickness of a panel absorber may be limited to a couple of centimeters, while the thickness of a separate body of foam material would be considerably larger.

In order to achieve high damping by the panel absorbers, the mechanical impedance is, in an embodiment, chosen approximately equal to the impedance of the gas in which the pressure waves propagate (in the present example air) to obtain an adequate coupling between the air pressure and the panel vibration.

Now again referring to FIG. 2, panel absorbers 13, 14, 15 and 16 may be placed at different suitable locations. Panel absorbers 13 are arranged on the side wall of reverberate stage compartment 11, panel absorbers 14 are arranged on shield plate 9 at the reticle stage side of reverberate stage 1, panel absorbers 15 are arranged on the top cover of the reverberate stage and panel absorbers 16 are arranged on projection system 3. In alternative embodiments, one or more of panel absorbers 13, 14, 15, 16 may be omitted or may be arranged at other or further suitable locations, such as a wall of projection system compartment 12, or at the bottom side of shield plate 9.

By provision of panel absorbers in the lithographic apparatus, the gas borne noise, e.g., the pressure waves or gas flows through caused by movement of patterning device stage 1 may be absorbed. This gas borne noise may be direct gas borne noise, e.g., gas flows or pressure waves directly caused by the movement of the patterning device stage 1, but also indirect gas borne noise, e.g., gas flows or pressure waves resulting from elements vibrating due to structure borne noise.

Due to the presence of panel absorbers 13 and 14 and 15 in patterning device stage compartment 11, acoustic reverberations are strongly reduced and hence the overall sound pressure levels in the patterning device stage are decreased. Because of this, fewer gas flows and/or pressure waves may pass the opening 10.

When gas flows and/or pressure waves pass opening 10 or any other gap between patterning device stage compartment 11 and projection system compartment 12, and enter into projection system compartment 12, the gas flows and/or pressure waves may be damped by panel absorbers 16 which are mounted on projection system 3. Panel absorbers 16 may be arcuate to correspond with the cylindrical outer surface of projection system 3. Any other suitable shape may also be used.

Although panel absorbers are described in embodiments as panel-shaped noise absorbing devices, any other type of suitable devices such as panel-shaped bodies of foam material may also be applied in another embodiment of the invention.

In an embodiment of the lithographic apparatus, panel-shaped noise absorbing devices may be provided for damping the gas borne noise caused by a movable object such as a patterning device stage, while shield plate 9 may be omitted.

Figure 4:
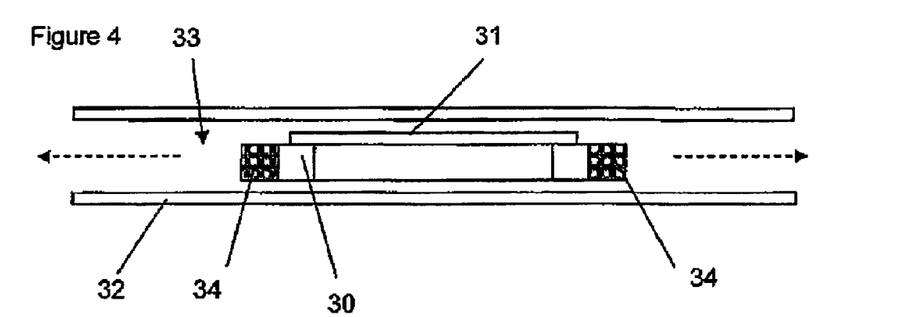
FIG. 4 depicts a passive noise dampener according to an embodiment of the invention.

FIG. 4 shows a part of a lithographic apparatus, in particular a side view of a patterning device stage 30 supporting a patterning device 31 in accordance with an embodiment of the invention. Such a patterning device stage 30 typically is provided to make a scanning movement along a direction of movement. During this scanning movement, the air, in the direction of movement, in front of patterning device stage 30 may be pressed away while at the same time air may be sucked into the space created by patterning device stage 30 at the back of patterning device stage 30. This movement may cause gas borne noise which may propagate towards the projection system as described in relation to the embodiment of FIG. 2.

Patterning device stage 30 is arranged between two frame plates 32 defining a patterning device stage compartment 33 there-between. Due to the presence of these plates 32 or any other construction element present in the lithographic apparatus which delimits the space wherein patterning device stage 30 is arranged, the movement of patterning device stage 30 may push relatively more air in front of patterning device stage 30 and suck more air in the space behind patterning device stage 30. Other constructions which may delimit the area in which reticle stage 30 is moved, may for instance be an illumination module, balance masses, noise shield plates and such.

In the embodiment of FIG. 4, a noise absorbing material or object 34 is added to the front and back of patterning device stage 30 to absorb the gas borne noise created by the movement of patterning device stage 30. This noise absorbing part/object may be a body of suitable material such as foam material, but also a panel absorber, a labyrinth, a membrane or bellow as shown in FIG. 4, or any combination thereof. The presence of such noise absorbing material or object 34 may decrease the amount of noise created by the movement of patterning device stage 30. As a result, this noise may not reach an element sensitive to this noise such as the projection system.

Figure 5:
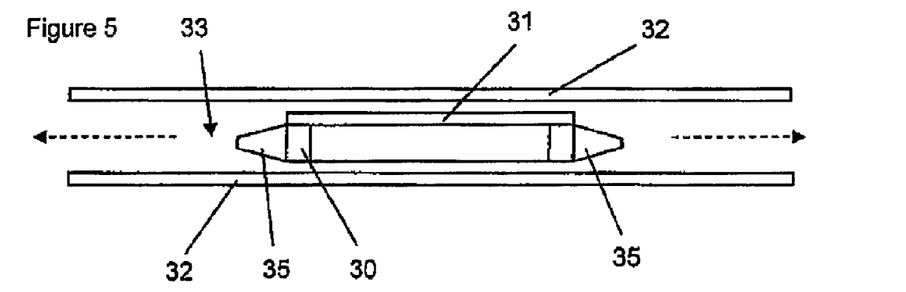
FIG. 5 depicts a passive noise dampener according to an embodiment of the invention.

FIG. 5 shows another arrangement in accordance with an embodiment of the invention, in which the front and back end of patterning device stage 30 are provided with an aero-dynamic structure or shape to prevent or reduce vortex shedding. The aero-dynamic structure is configured to improve penetration of stage 30 through gas surrounding stage 30. In particular the front and back area of the patterning device stage are reduced to reduce the gas resistance with respect to the movement of patterning device stage 30. Any suitable shape which reduces the gas resistance of patterning device stage 30 may be used to reduce the gas flows and/or pressure waves caused by movements of patterning device stage 30 in order to avoid gas borne noise which may excite elements sensitive to such noise such as the projection system.

Figure 6A:
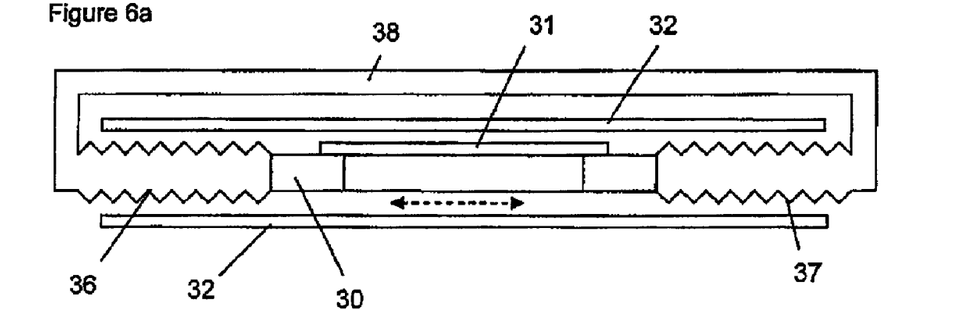
FIGS. 6a and 6b depict a passive noise dampener according to an embodiment of the invention.
Figure 6B:
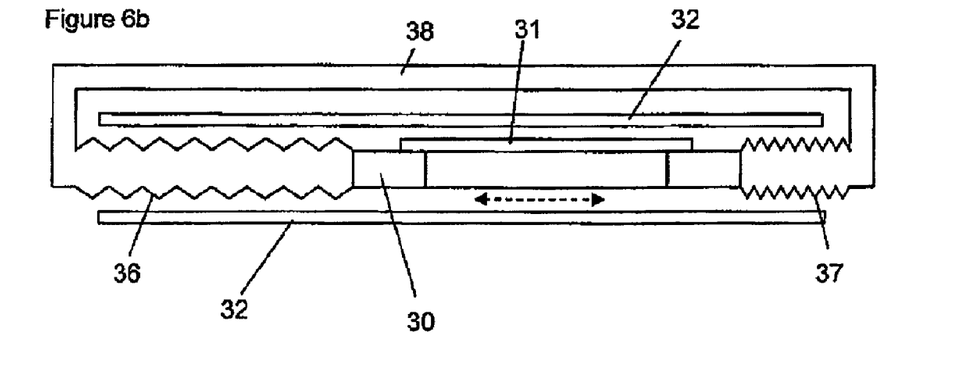

FIGS. 6a and 6b show yet another alternative arrangement in accordance with an embodiment of the invention for the reduction of gas borne noise caused by movement of patterning device stage 30. In the embodiment of FIGS. 6a and 6b, a first bellows 36 is attached to a first end of patterning device stage 30 while a second bellows 37 is attached to an opposite end of the patterning device stage in the direction of movement. First bellows 36 and second bellows 37 are connected to each other via conduit 38.

In FIG. 6a, patterning device stage 30 is shown in a center position. When the patterning device stage for instance is moved to the right, second bellows 37 is compressed, while first bellows 36 is extended. The gas, which is pressed out of second bellows 37 due to the compression of second bellows 37, is pressed via conduit 38 towards first bellows 36 which extends. Since the internal volume of first bellows 36, second bellows 37 and conduit 38 remains the same, the volume of gas pressed away in front of patterning device stage 30 may fill the empty space left behind the patterning device stage at the opposite side.

In FIG. 6b, the patterning device stage is shown when it has been moved to the right. It can be seen that first bellows 36 is extended, while second bellows 37 is compressed. When patterning device stage 30 is moved in the opposite direction, the gas in the enclosed system will flow back from the left side of patterning device stage 30 to the right side of patterning device stage 30 via conduit 38.

Since the front and back side in the direction of movement of patterning device stage 30 are connected to each other with an enclosed gas system, the noise resulting from movement of patterning device stage 30 is substantially reduced. Furthermore, since the gas is present in the enclosed gas system, any flows or pressure waves may substantially remain in the enclosed system and these flows or pressure waves may not reach the projection system or any other element sensitive to this noise.

The above described noise reducing dampeners (or noise reducing devices) may be applied alone or in combination to obtain an effective noise reduction of the noise created by movement of patterning device stage 30 or any movable object in general. In addition thereto, or as an alternative, it is possible to provide an enclosed gas system, wherein the movable object is moved, containing a gas having a lower density than the normally used gas, for instance a vacuum environment instead of air under atmospheric pressure. For example, a pressure of the enclosed gas in the enclosed gas system may be lower than 1 atm. Also, it is possible to decrease or adapt the surface of the element sensitive for the gas borne noise in order to decrease the influence of the noise.

In an embodiment, the passive noise dampener includes a movable part, configured to move in an opposite direction of the movable patterning device stage such that a balance of gas flow, or pressure waves, or both created by both the movable part and the movable patterning device stage may be obtained. The movable part may be structurally designed so to substantially balance the gas flow, or pressure waves or both created by the movable patterning device stage.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
   an illumination system configured to condition a radiation beam;
   a substrate table constructed to hold a substrate;
   a projection system configured to project the radiation beam onto a target portion of the substrate; and
   a passive noise dampener comprising a first bellows connected to a first side of a movable object and a second bellows connected to a second side, opposite to the first side, of the movable object, wherein the first and second bellows are connected to each other and configured to dampen gas borne noise caused by a movement of the movable object.

2. The lithographic apparatus of claim 1, wherein the movable object is a patterning device support constructed to support a patterning device, the patterning device configured to impart the radiation beam with a pattern in its cross-section.

3. The lithographic apparatus of claim 1, wherein the passive noise dampener comprises a first space located before and a second space located after the movable object along a direction of movement, the first bellows configured to guide gas pressed out of the first space to the second bellows containing the second space during the movement of the movable object.

4. A method for reducing gas borne noise in a lithographic apparatus, the method comprising:
   moving a movable object of the lithographic apparatus; and
   dampening gas borne noise caused by movement of the movable object, using a passive noise dampener comprising a first bellows connected to a first side of a movable object and a second bellows connected to a second side, opposite to the first side, of the movable object, wherein the first and second bellows are connected to each other.

5. A device manufacturing method comprising:
   projecting a patterned beam of radiation onto a substrate using a lithographic apparatus;
   moving a movable object of the lithographic apparatus; and
   dampening gas borne noise using a passive noise dampener comprising a first bellows connected to a first side of the movable object and a second bellows connected to a second side, opposite to the first side, of the movable object, wherein the first and second bellows are connected to each other.

6. The method of claim 5, wherein the moving a movable object comprises moving a patterning device support configured to support a patterning device, the patterning device configured to pattern a beam of radiation to form the patterned beam of radiation.

* * * * *